United States Patent
Trumble et al.

(10) Patent No.: US 6,313,412 B1
(45) Date of Patent: *Nov. 6, 2001

(54) METHOD OF ASSEMBLING SUBSTRATES AND ELECTRONIC COMPONENTS

(75) Inventors: William P. Trumble, Kanata; Murray W. Hamilton, Stittsville; David Bilton, Ottawa, all of (CA)

(73) Assignee: Nortel Networks Limited, Montreal (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/129,771

(22) Filed: Aug. 6, 1998

Related U.S. Application Data

(63) Continuation-in-part of application No. 08/719,300, filed on Sep. 19, 1996, now abandoned.

(51) Int. Cl.⁷ .......................................... H05K 1/16
(52) U.S. Cl. .................. 174/260; 174/261; 228/56.3; 257/677; 420/122; 420/560
(58) Field of Search ..................... 174/263, 260, 174/261; 228/56.3; 420/122, 560; 257/772, 666, 677

(56) References Cited

U.S. PATENT DOCUMENTS

| | | |
|---|---|---|
| 2,671,844 | 3/1954 | Laubmeyer et al. ................. 219/85.2 |
| 4,778,733 | 10/1988 | Lubrano et al. ..................... 428/647 |
| 5,297,008 | 3/1994 | Estes ................................... 361/773 |
| 5,444,293 * | 8/1995 | Li .......................................... 257/666 |
| 6,086,687 * | 7/2000 | Oud et al. ......................... 420/560 X |

FOREIGN PATENT DOCUMENTS 2158459A  11/1985  (GB) .

OTHER PUBLICATIONS

Paul P. Conway, "Solderability testing of alternate component termination materials with lead free solder alloys", IEEE/CPMT Int'l Electronics Manufacturing Technology Symposium, pp245–251, 1995.*

* cited by examiner

Primary Examiner—Albert W. Paladini
(74) Attorney, Agent, or Firm—Angela C. de Wilton

(57) ABSTRACT

A method of assembling a substrate and an electrical or electronic component, the component having electrically conductive leads with surfaces of an alloy from the list consisting of tin, nickel, tin copper, tin silver, nickel palladium, gold palladium, and silver palladium, and the leads being soldered to copper-based terminals of the substrate by a solder alloy, the solder alloy comprising, by weight, 99.3% tin and 0.7% copper. The soldering takes place in a chamber having a nitrogen inert atmosphere. Lead solder is thus avoided.

4 Claims, 1 Drawing Sheet

METHOD OF ASSEMBLING SUBSTRATES AND ELECTRONIC COMPONENTS

This application is a continuation-in-part of application Ser. No. 08/719,300 filed Sep 19, 1996, now abandoned. This invention relates to assemblies of substrates and electronic components.

FIELD OF THE INVENTION

BACKGROUND OF THE INVENTION

In conventional assemblies of substrates and electronic components, electrical circuitries carried by the substrates have terminals for connection to electrical terminal leads of the components. For this purpose, a solder is used which has a lead constituent. These lead containing solders are known to be largely reliable for forming permanent electrically conductive solder joints between terminals and electrical conductive leads. However, lead, it is now realized, is an undesirable material to be used in industry. When used in solder, it is not a captive constituent of the solder material and is known to be environmentally unfriendly and is toxic. Conceivably it is dangerous for use both by the manufacturing worker and by the consumer. Lead presents health hazards in manufacturing, disposal, and use of assemblies, and problems arise in the safe disposal of scrap materials containing lead.

Various assemblies have been made in which leadless solder has been used. However, problems are found during manufacturing where lead is not a component of solder as resultant solder joints are found to be unreliable as separation and cracking occurs.

In Great Britain Patent 2,158,459 Tallis teaches a leadless solder and method for forming a fluid-tight, soldered joint between a pair of tubular members of copper or copper alloy in the plumbing industry, the solder comprising 0.3%–0.7% copper by weight, the balance being tin and impurities. However, considerations such as electrical conductivity, miniature component sizes and thermal cycling over wide temperature ranges are quite different in the electronics industry. For example, oxides must be completely eliminated from electronic solder joints because they affect signal transmission and weaken the metallic integrity of the joints, thus causing cracking. These cracks create capacitances at high frequencies, and thus techniques employed by Tallis are inapplicable to assembling electrical components to substrates.

In U.S. Pat. No. 4,778,733 Lubrano also teaches a low toxicity, corrosion resistant solder for use in plumbing. It comprises a tin content of 92% to 99%, a copper content of 0.7% to 6%, and a silver content of 0.05% to 3%. As silver is an expensive precious metal, its use should be avoided to keep the solder from being prohibitively expensive.

"Whiskers" are hairline cracks that form on component leads as a result of a build up of internal stresses as due to plating. When using tin, which has a melting temperature of 232° C., as a plating metal, it was found that the standard tin/lead solder having a percentage weight composition of 63%/37% respectively and a melting temperature of 183° C., never raised the temperature of the tin finishes on the components high enough to relax the stresses, thus providing a candidate for component failure.

SUMMARY OF THE INVENTION

The present invention seeks to provide a method of assembling a substrate and an electronic component which minimizes or overcomes the above lead free solder problems.

Accordingly, the present invention provides a method of soldering comprising: providing a chamber having a low oxygen atmosphere; providing an electronic component having a plurality of electrically conductive leads each of which comprises a core provided with a surface layer comprising an alloy, the surface layer having a soldering temperature; providing a solder alloy consisting of tin and copper, the tin of the solder alloy having a weight at or around 99.3% of the total weight of the solder alloy and the copper having a weight at or around 0.7% of the total weight of the solder alloy; and soldering the leads of the electronic component onto copper-based terminals in the chamber by raising the temperature of the terminals and of the surfaces of the leads at the terminal positions to the soldering temperature of the solder.

Preferably the low oxygen atmosphere has an oxygen level less than 75 ppm (parts per million), and uses nitrogen as the inert gas. In the method of assembly in a preferred and practical arrangement, each of the electrically conductive leads has a conductive body with a surface layer comprising an alloy from the list consisting of tin, nickel, tin copper, tin silver, nickel palladium, gold palladium, and silver palladium, and the conductive body necessarily remains solid, i.e., unsoftened, at the softening temperature of the coating.

The solder must be such that during rise in temperature, it comprises a pasty constituent for soldering purposes at or around a specific temperature, and will solidify to provide a solder joint immediately upon removal of heat. A eutectic solder alloy having these requirements is provided by tin having a weight percent at or around 99.3% of the total weight of the solder and with the copper being at or around 0.7% of the total weight of the solder. It is also preferable that the alloy in the coating of each electrically conductive lead has approximately the percentage weights referred to above of the constituent parts are copper and tin. Hence, the coating and the solder are in the same physical pasty state at soldering temperature. This temperature is at approximately 227° C.

A flux to be used with the above solder according to the invention must be compatible with the solder. It must also be a flux which is operable at the desired soldering temperatures which are envisaged for the invention. An organic no-clean flux is considered to be most desirable and this flux is one which should be active at the temperature which the solder alloy has the pasty constituent, i.e. around 227° C., and will successfully remove oxides of copper and tin. Such a flux suitable for this purpose is that referred to as X39 flux manufactured by Multicore Solders Inc. of Richardson, Tex.

BRIEF DESCRIPTION OF THE DRAWINGS

One embodiment of the invention will now be described, by way of example, with reference to the accompanying drawings, in which.

DETAILED DESCRIPTION OF THE PREFERRED EMBODIMENT

Figure 1:
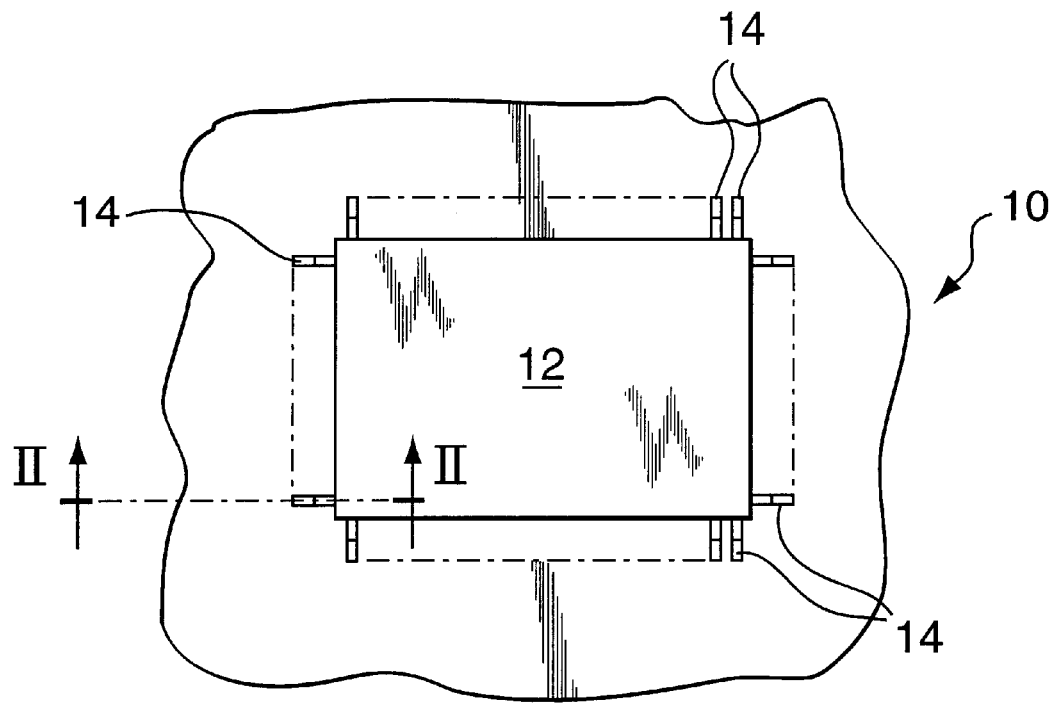
FIG. 1 is a plan view of part of a printed circuit board having an electronic component mounted therein.
Figure 2:
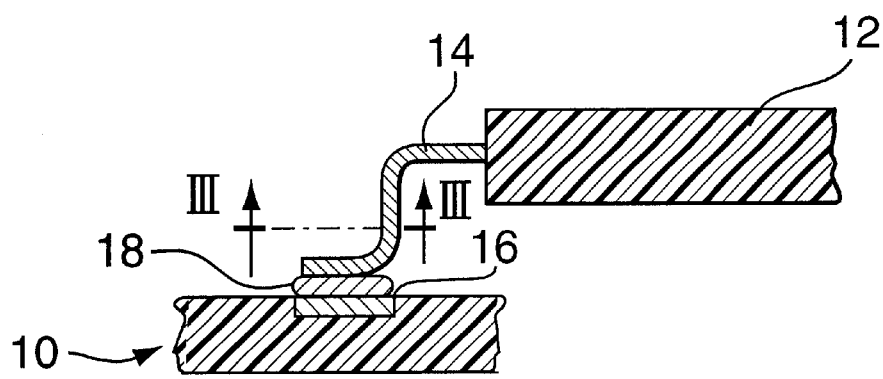
FIG. 2 is a cross-sectional view taken along line II—II in FIG. 1 and to a larger scale of part of the printed circuit board and showing one of the leads of the component secured thereto.
Figure 3:
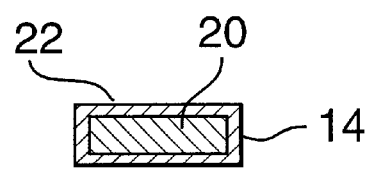
FIG. 3 is a cross-sectional view of the lead taken along line III—III in FIG. 2 and to a larger scale.

In the embodiment as shown by FIGS. 1, 2 and 3, a substrate comprises a printed circuit board 10 having mounted therein a plurality of surface components 12 only one of which is shown by the drawings. Each of the components 12 has leads 14 which are soldered to terminal pads 16 (FIG. 2) of the printed circuit board 10. In the embodiment as in the invention, the structure avoids the use of lead materials in the solder to be used for attaching the terminals permanently to the terminal pads 16. Thus, in the embodiment solder 18 located between ends of the leads 14 and the terminal pads 16 is composed of a eutectic solder alloy of tin and copper. This alloy in this instance has a quantity of tin with a weight percent at or around 99.3% of the total weight of the solder with the remainder of the solder, i.e. 0.7% of the total weight, being copper. The solder is compatible with the copper terminal pads 16 so that a soldering operation will permanently attach the solder 18 to each of the terminal pads.

It is also necessary for the solder to be compatible for soldering purposes to the surface material of each of the leads 14. With this object in mind, each of the leads is formed from a core 20 having a coating of a material which is compatible with the solder, for example tin, nickel, tin copper, tin silver, nickel palladium, gold palladium, and silver palladium. This coating 22 in this particular case is provided by a tin copper alloy which is preferably of the same composition as the solder alloy 18. In this case, the coating 22 on each of the leads 14 is an alloy having tin with a weight percent of around 99.3% of the total weight of the coating with the remainder of the coating, i.e. 0.7% of the total weight, being formed from copper. It is essential that the core 20 of each of the leads should be formed from a material which not only is capable of supporting the coating 22 but also one which remains in an unsoftened or unmelted condition at soldering temperatures. Thus, in this particular embodiment, each of the cores 20 may be formed from an alloy of tin, silver and copper alloy or an alloy such as silver palladium alloy.

An important aspect of printed circuit board soldering is to have the molten solder cover the entire substrate terminal, commonly referred to as "wetting". Incomplete wetting can threaten the integrity of the solder joint, making it more susceptible to failure. In order to achieve proper wetting with the above solder alloy, it is preferable that the soldering process be carried out in a chamber with an atmosphere having an oxygen content of less than 75 ppm. Ideally, nitrogen is used as the inert gas. Without a nitrogen inert atmosphere, incomplete wetting may occur, and the solder surfaces may be rough in texture and the no-clean flux residue may turn a dark brown colour as a result of oxidization.

During the soldering process, which may be by wave soldering, reflow soldering or wire bond soldering techniques, the eutectic solder alloy has a pasty constituent which rapidly forms at a specific temperature around 220° C. or between 227° C. and 240° C. and which upon removal of the heat immediately returns to a solid condition. This sudden return to a solid condition is particularly important in that accuracy in fixed location of each of the leads 14 of the electronic component upon the board is an absolute necessity when subsequent process steps are to be followed after the soldering operation. In addition, the flux which is to be used needs to be compatible with the solder, the terminal pad 16 and with the coating layers 22. Such a suitable flux is that known as flux X39 made by Multicore Solders Inc. of Richardson, Tex. This flux is known to be active at temperatures of around and slightly above 227° C. for removal of copper tin oxides from metal surfaces.

It is found that after the soldering operation, the solder 18 efficiently solders each of the leads 14 to the terminal pads 16. As the material of the coating layers 22 is the same as the solder 18, then there is a fusion between the pads 18 and the coating layers 22 so that at their interfaces, the layers 22 and the solder 18 become metallurgically integral. Integrity of the solder also takes place between the solder 18 and the terminal pads 16 through the copper constituent of the solder.

It is found that with the above construction, an efficient solder junction is provided between each of the leads 14 and its terminal pad 16. The solder junction in each case is reliable in manufacture and is not known to crack or break away. In addition to this, of course, the main object of the invention is realized in that the use of lead as a component of solder is avoided together with its attendent manufacturing use and scrap disposal problems.

What is claimed is:

1. An assembly of a substrate and an electronic component wherein the substrate has a plurality of terminals and the component has a plurality of electrically conductive leads each of which comprises a core provided with a surface layer consisting of an alloy, the surface layer having a soldering temperature, the electrically conductive leads being soldered to the terminals by means of a solder alloy consisting of a binary eutectic alloy of tin and copper, having a composition of 99.3% by weight of tin and 0.7% by weight of copper and having a melting point of 227° C., the soldering temperature of the surface layer of the core being at or above 227° C., and the core of each of said electrically conductive leads being of a material which remains solid at the soldering temperature of the surface layer.

2. An assembly according to claim 1 wherein the surface layer of the core comprises an alloy from the list consisting of tin, nickel, tin copper, tin silver, nickel palladium, gold palladium, and silver palladium.

3. An assembly according to claim 1 wherein the surface layer of the core is provided by a eutectic alloy of tin copper having a composition of 99.3% by weight of tin and 0.7% by weight of copper having a melting temperature of 227° C.

4. An assembly according to claim 1 wherein the soldering temperature of the surface layer of the core is between 227° C. and 240° C.

* * * * *